United States Patent [19]

Gualandris et al.

[11] Patent Number: 5,041,885
[45] Date of Patent: Aug. 20, 1991

[54] SURFACE FIELD EFFECT TRANSISTOR WITH DEPRESSED SOURCE AND/OR DRAIN AREAS FOR ULSI INTEGRATED DEVICES

[75] Inventors: Fabio Gualandris, Bergamo; Aldo Maggis, Vimercate, both of Italy

[73] Assignee: SGS-Thomson Microelectronics, s.r.l., Italy

[21] Appl. No.: 518,070

[22] Filed: May 2, 1990

[30] Foreign Application Priority Data

May 2, 1989 [IT] Italy .................. 83621 A/89

[51] Int. Cl.$^5$ .............. H01L 29/10; H01L 27/02; H01L 29/06; H01L 29/78
[52] U.S. Cl. ................... 357/23.4; 357/41; 357/55; 357/56
[58] Field of Search ............ 357/234, 23.5, 55, 56

[56] References Cited

U.S. PATENT DOCUMENTS

| 4,167,745 | 9/1979 | Ishibashi et al. | 357/23.4 |
| 4,625,388 | 12/1986 | Rice | 357/23.4 |
| 4,907,048 | 3/1990 | Huang | 357/23.4 |
| 4,935,789 | 6/1990 | Calviello | 357/56 |
| 4,949,136 | 8/1990 | Jain | 357/23.4 |
| 4,985,744 | 1/1991 | Spratt et al. | 357/55 |

FOREIGN PATENT DOCUMENTS

| 53-62985 | 6/1978 | Japan | 357/23.4 |
| 57-133675 | 8/1982 | Japan | 357/23.4 |
| 2011170 | 7/1979 | United Kingdom | 357/23.4 |

OTHER PUBLICATIONS

Chakravasti et al., "Double-Diffused Metal-Oxide Silicon FET," IBM Technical Disclosure Bulletin, vol. 19, No. 4, Sep. 1976, pp. 1162-1163.

Primary Examiner—Andrew J. James
Assistant Examiner—Cynthia S. Deal
Attorney, Agent, or Firm—Pollock, Vande Sande & Priddy

[57] ABSTRACT

A surface field effect integrated transistor has the surface of the silicon in the source and drain areas lowered by 50-500 nm in respect to the surface of the silicon underneath the gate electrode by etching the silicon substrate before forming the source and drain junctions.

The transistor is sturdy and reliable because of the backing-off of the multiplication zone of the charge carriers from the gate oxide by a distance greater than several times the mean free path of hot carriers, thus markedly reducing the number of hot carriers available for injection in the gate oxide.

The modified fabrication steps are readily integrable in a normal CMOS fabrication process.

6 Claims, 4 Drawing Sheets

SURFACE FIELD EFFECT TRANSISTOR WITH DEPRESSED SOURCE AND/OR DRAIN AREAS FOR ULSI INTEGRATED DEVICES

BACKGROUND OF THE INVENTION

1. Field of the Invention

The present invention relates to a structure of integrated surface field effect transistors particularly suited for the fabrication of ultra large scale integration (ULSI) devices.

2. Description of the Prior Art

The push to increase the density of integration of monolithically integrated semiconductor devices often forces the reduction of the size of single integrated devices without simultaneously being able to reduce supply voltages by a comparable scale factor. On the other hand also in ULSI devices certain characteristics of a surface field effect transistor cannot be traded off; namely:

(a) a sufficiently high gain under operating conditions;
(b) a "punchthrough" voltage higher than the maximum operating voltage and consequently a certain reduction of the leakage current under cut-off conditions;
(c) a positive shifting of possible "snap-back" phenomena beyond the so-called absolute maximum rating (AMR);
(d) sturdiness and stability of electrical characteristics (i.e. threshold voltage and gain) even after an injection of hot carriers (electrons or holes) in the gate oxide (or equivalent dielectric);
(e) preservation of a substantial integrity of the gate dielectric even after the injection of hot carriers or the occurence of electrostatic shocks (notably the effect of these phenomena is not normally evidenced by an immediate degradation of the electrical characteristics but eventually leads to a failure of the device after a certain period of operation).

As it is well known to the skilled technician and amply described in literature, the (a) requisite imposes a precise trimming of certain fabrication steps while, for satisfying the (b) requisite, two alternative techniques are known: a first technique requires a deep ion implantation in the channel region, known as "antipunchthrough" implantation, of impurities of the same polarity of those already present in the same channel region (e.g. in the monocrystalline silicon substrate in which the transistor is made, i.e. a P-type region for an N-channel transistor and an N-type region for a P-channel transistor) for locally increasing the impurity concentration; an alternative technique which is normally used in relatively advanced fabrication processes and which is also known as the Double Diffused Drain (DDD) technique, consists in confining the depletion region of the source and drain junctions (diffused regions) by means of an ion implantation of impurities of polarity opposite to the polarity of the impurities used for forming the diffused regions, i.e. the drain and source junction regions themselves.

The requisites (c), (d) and (e) are all directly or indirectly connected to the physical phenomenon known as "multiplication" (of charge carriers) which is originated by the following physical factors:

(1) presence of a strong electric field in the drain region which causes: the reaching of a "saturation" limit value of the mean velocity of carriers, impact ionization and a multiplication current in the drain junction;
(2) presence of a sharp bend of the drain junction and reduction of the thickness of the gate dielectric in devices with a high level of integration which contribute to increase further the intensity of the electric field thus enhancing a so-called "gate-diode" behaviour;
(3) proximity between intense electric field points in the silicon and the gate dielectric layer which favors the presence of hot carriers near the interface between the dielectric layer and the silicon;
(4) a peculiar orientation of the electric field at the drain junction, which becomes more evident under certain operating conditions of the transistor, which favors the trapping of hot carriers in critical zones for the degradation of the electrical characteristics or in any case which can be presumably damaging for the integrity of the dielectric oxide (e.g. underneath the base of the lateral oxide spacers formed on the flanks of the gate electrode).

In order for the integrated transistor to retain the above-mentioned requisites: (c), (d) and (e), different solutions are known such as: the drain extension technique (DE), the graduated drain doping technique (GDD) and the light drain doping technique (LDD). These techniques, through respectively different additional steps of the sequence of steps of the fabrication process, tend to "couple" the channel region of the transistor to the drain junction region (having a relatively high impurity concentration) through an intermediate region doped with impurities of the same type of the impurities of the drain region but having a concentration lower than the latter by at least one or two orders of magnitude. By comparison, the three known solutions cited above have well recognized relative advantages and drawbacks; however only the LDD technique may be practically implemented also in ULSI processes.

OBJECTIVE AND SUMMARY OF THE INVENTION

In view of this state of the art, it is an objective of the present invention to provide an integrated structure for a surface field effect transistor having characteristics capable of decisively producing a reduction of the current multiplication phenomenon in the drain junction, while being perfectly integrable in high level of integration or ULSI fabrication processes.

In accordance with the present invention this objective is reached by means of a novel surface field effect transistor structure wherein, at least in an area corresponding to the drain region of the transistor, the surface of the semiconducting substrate is depressed relatively to the level of the surface of the semiconducting substrate in the respective gate area of the transistor. This may be obtained by etching the monocrystalline silicon commonly constituting the semiconducting substrate in the drain area in order to lower the level of the surface of the substrate by a depth of between about 50 and about 500 nanometers (nm). Below 50 nm the beneficial effects are substantially lost while above 500 nm an eccessive reduction of the gain may also be observed. According to an embodiment of the invention, also the respective area corresponding to the source region of the transistor is symmetrically lowered similarly to what is made in the drain area. This allows use of the same mask which is normally utilized in the standard fabrication process of these integrated devices without requiring an additional mask for singularly defining the drain areas.

Essentially the new structure makes it possible to back-off from the critical zone of the transistor the region of maximum electric field intensity, thus markedly reducing the corner and "pinch" effects caused by the gate dielectric layer (e.g. gate oxide) and effectively disabling the mechanism known as "gated-diode" behaviour. Furthermore the distance between the multiplication zone of the charge carriers and the critical region of the transistor structure (e.g. the channel region) is increased by a length which is at least several times the mean free path of the charge carriers thus permitting a greater degree of recombination of hot carriers which will no longer be available for injection in the dielectric gate layer.

As a consequence of the depression of the drain region with respect to the gate electrode, the electric field orientation at the drain is advantageously modified and assumes a less favorable orientation to the injection mechanism of hot carriers in the gate oxide.

Naturally the lowering of the surface level of the drain region (and of the source region) with respect to the gate electrode has the effect of determining a certain "decoupling" of the source and drain junctions from the channel region of the transistor, however this effect which if not limited could heavily reduce the gain of the transistor, may be easily compensated by appropriate expedients, such as by rounding the bottom corner of the excavation produced in the silicon substrate and/or by implanting the side walls of the excavated silicon by inclining repeatedly the wafer with respect to the direction of the accelerated ion beam.

The process steps for fabricating a MOSFET structure in accordance with the present invention may be easily integrated in the flow sheet of a standard MOS fabrication process.

BRIEF DESCRIPTION OF THE DRAWINGS

The characteristics and advantages of the present invention will become more evident through the following detailed description of an embodiment thereof, illustrated herein for a nonlimitative exemplification purpose in the appended drawings, wherein.

FIGS. from 5 to 9 schematically depict the principal steps which characterize the fabrication process of the invention for the novel MOSFET structures shown in the preceding figures.

In all the figures, a "symmetric" integrated structure of a surface field effect transistor, e.g. a typical MOSFET, is depicted. As customary in the state of the art, the source and drain regions, formed respectively on one side and on the other side of the gate structure of the transistor are shown symmetrically identical to each other being indistinctly formed through the same fabrication steps. It must be understood that the source and drain regions may also be formed distinctly one from the other and that, for the objectives of the invention, the semiconducting substrate may be excavated only in the drain region.

DESCRIPTION OF THE PREFERRED EMBODIMENTS

Figure 1:
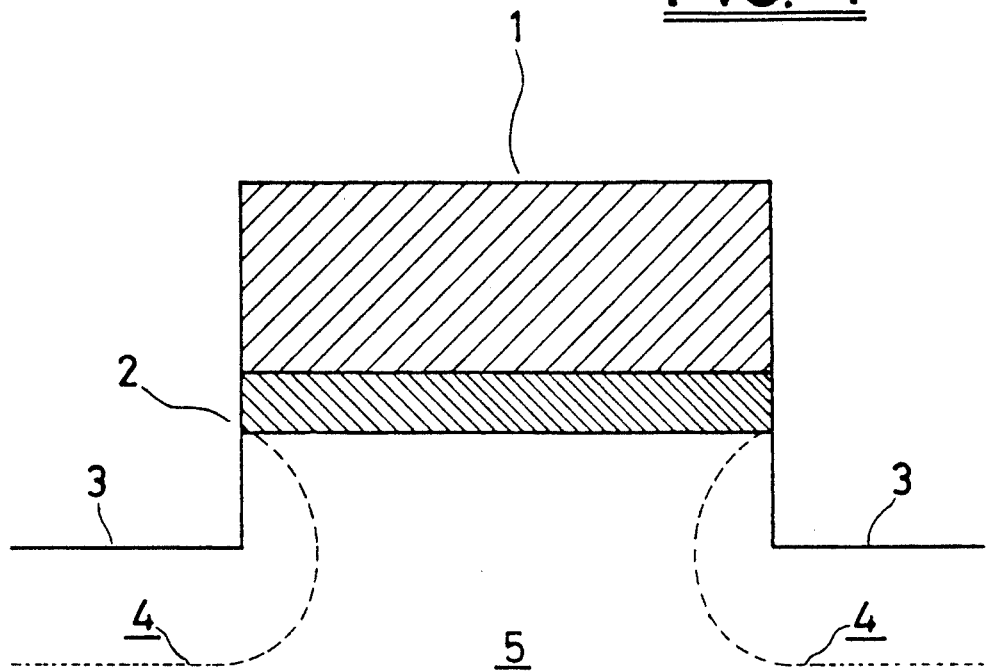
FIG. 1 schematically depicts the structure of a surface field effect transistor object of the present invention.

In a first embodiment schematically depicted in FIG. 1, a MOSFET structure made in accordance with the invention comprises a gate electrode 1, isolated by a dielectric gate oxide layer 2 from the surface of a monocrystalline silicon substrate 5 having an electrical semiconductivity of a first type wherein the MOSFET structure is realized and which constitutes also the channel region of the transistor. On the source and drain areas 3, respectively on one side and on the other side of the gate electrode 1, the surface of the monocrystalline silicon 5 has a level lower than the level of the surface of the silicon in the area of the channel region which is topped with the gate oxide 2 and the gate electrode 1. The source and drain regions or junctions 4 are made by diffusing in the monocrystalline silicon substrate 5 atoms of a dopant capable of inducing in the silicon of the diffused regions 4 an electrical conductivity of a polarity opposite to the polarity of the channel region, i.e. of the silicon substrate 5.

As it is easily observed in FIG. 1, the depression of the silicon surface in the drain area (and for symmetry also in the source area) of the transistor determines a definite backing-off of the zone having the greatest electric field intensity, which corresponds to the edge of the junction region 4, from the gate oxide 2. In this way the distance between the multiplication zone and the channel zone of the transistor is increased by a length which corresponds positively to a multiple number of times the mean free path of charge carriers in silicon, which carriers because of recombination can hardly become available for injection in the gate oxide 2.

Figure 2:
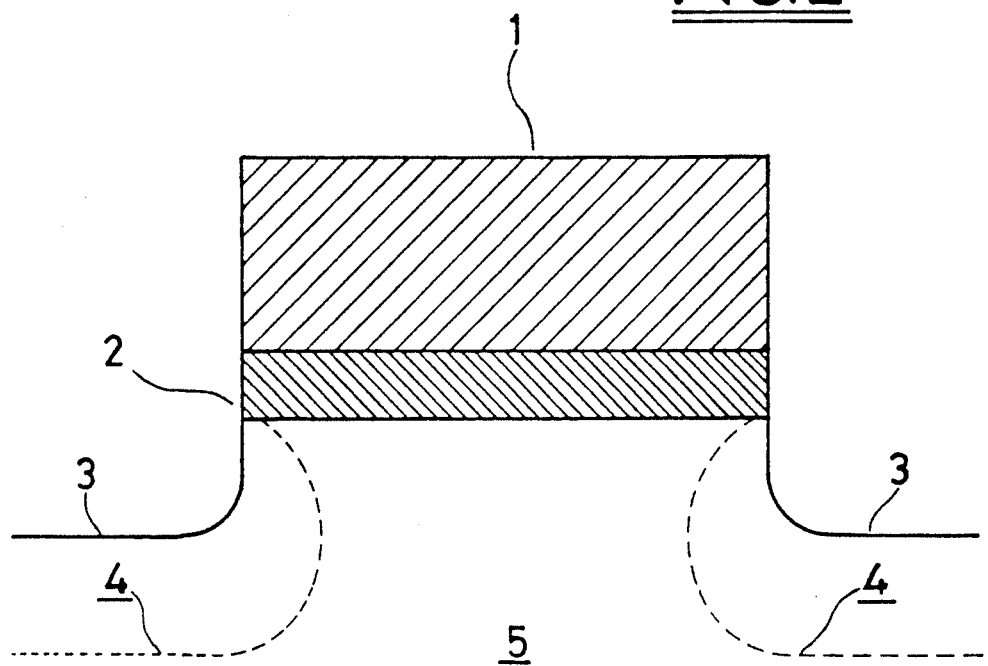
FIG. 2 shows the structure of a surface field effect transistor of the invention according to a first alternative embodiment thereof.

This beneficial aspect of the lowering of the silicon surface in the drain region with respect to the gate region (channel region) is even more marked by rounding the bottom corner of the excavation produced in the silicon as shown in FIG. 2. The rounding of the bottom corner of the etched silicon determines an even more favorable profile of the drain and source junction regions 4 for further moving away the maximum electric field intensity zone from the channel region of the transistor (i.e. from the interface with the gate oxide layer 2).

Figure 3:
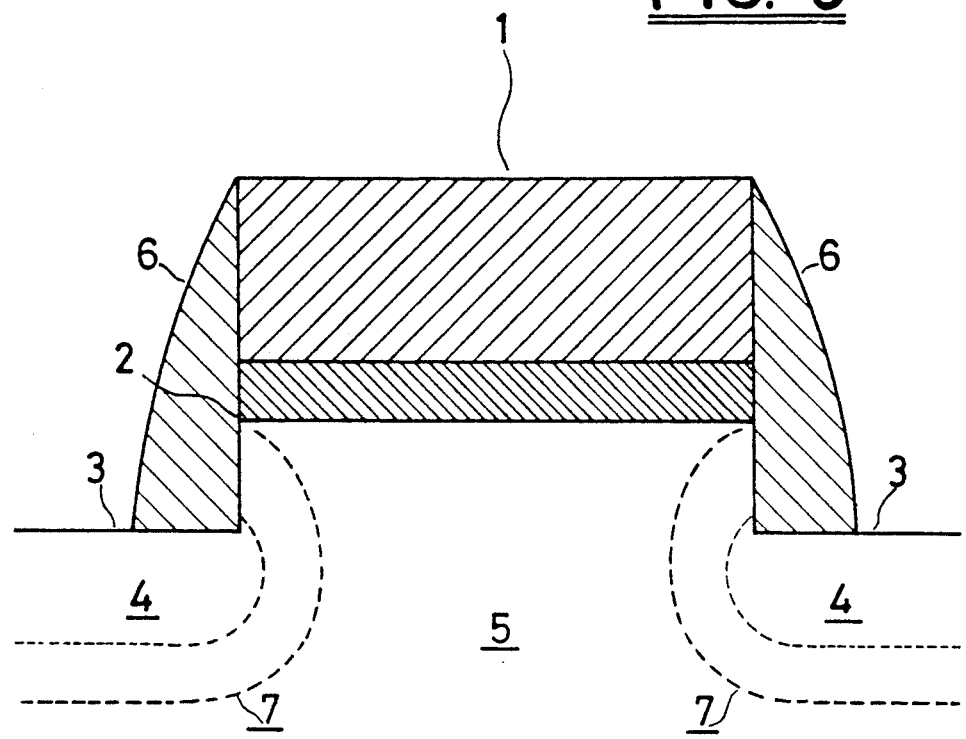
FIG. 3 schematically shows the structure of a surface field effect transistor of the invention according to a second alternative embodiment thereof.

An alternative embodiment of the MOSFET structure of the invention is depicted in FIG. 3. In this embodiment, tapered oxide spacers 6 are formed on both sides of the gate electrode, according to a well known technique. The spacers permit an implantation of the dopant for forming the drain and source junctions 4 in a self-alignment condition in respect of the preformed gate structure. The transistor structure shown in FIG. 3 further embodies the so-called graduated drain doping technique (GDD) which consists in implanting the source and drain areas, defined by the oxide spacers 6, a first time with a certain dopant species having a certain diffusion coefficient in silicon, partially diffusing the implanted atoms (i.e. Boron-BF2 or Arsenic-Phosphorous) and implanting a second time the same areas with the same dopant species or with different dopant species of the same polarity but having a diffusion coefficient in silicon lower than the first implanted species (i.e. arsenic on areas previously implanted with phosphorus) and further proceeding to a diffusion heat treatment. These well known techniques determine the formation of regions 7, doped substantially either with only the dopant of said first species having a high diffusivity or with a reduced concentration determined solely by the charge implanted during said first implantation and of inner regions 4 heavily doped with dopants of the same polarity of both species or with a "summed" concentration. Also in this case a decisive effect of the backing-off of the points of more intense electric field, due to the lowering of the silicon level in the drain area in respect to the silicon level of the channel region of the transistor, adds to the known beneficial effects of graduating the doping of the drain region (and optionally also of the source region for symmetry of fabrication).

Figure 4:
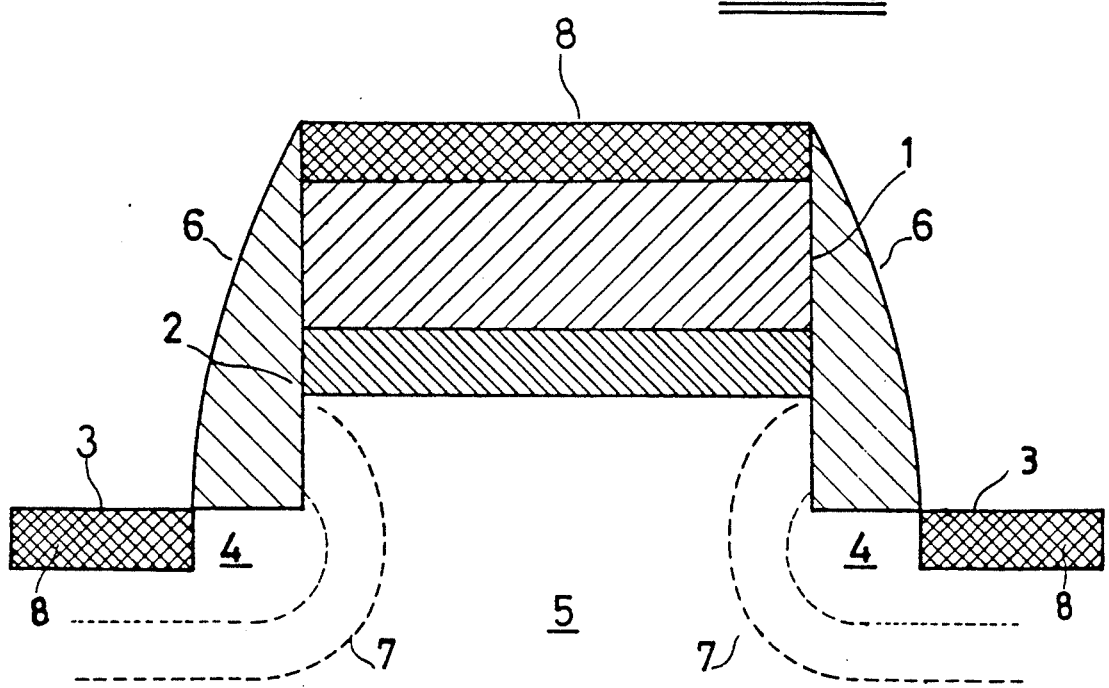
FIG. 4 schematically shows the structure of a surface field effect transistor of the invention according to a third alternative embodiment thereof.

In FIG. 4, a MOSFET structure similar to the one depicted in FIG. 3, is provided further with a layer of silicide deposited on the silicon in the source and drain junction area and on the gate electrode 1 (commonly of polycrystalline silicon) in accordance with a well known technique. Also in this case also the lowering of the silicon surface level in the drain region respectively to the channel region of the transistor is decisive for improving the reliability characteristics of the integrated device.

Generally the thickness of the gate oxide 2 will be comprised between 10 and 100 nanometers (nm). The gate electrode 1 may be made with N+ or P+ doped polycrystalline silicon or with a multilayer formed by a first layer of polycrystalline silicon 1 and a second layer of silicide 8, as depicted in the embodiment shown in FIG. 4. The implantation of dopants for forming the source and drain junctions 4 (or 4 and 7, respectively, in the case of the structure depicted in FIG. 4) may preferably be carried out by exposing the wafer of silicon to the impinging ion beam through varying angles of inclination of the wafer plane in order to obtain an implantation also in correspondence of the bottom corner of the depressions produced by etching in the silicon and also to some measure on the vertical walls of the etched depressions of the silicon substrate.

The level of the surface of the silicon in the drain area is preferably lowered by a depth comprised between about 50 and about 500 nanometers (nm) from the level of the surface of the silicon substrate in the gate area of the transistor. The technique which may be used for excavating the silicon in the defined source and drain areas may be the same which is normally used for forming isolation trenches in silicon.

The structure of the MOSFET transistor of the invention which may be named "TRENCH MOSFET", is perfectly integrable in the flow sheet of a common CMOS fabrication process. The modified CMOS fabrication process of the invention may be exemplified through the series of FIGS. from 5 to 9.

A normal CMOS fabrication process may be followed without modifications as far as the oxidation treatment for forming the gate oxide layer of the integrated transistors, whether the latter belongs to a P-tub, N-tub or Twin-tub type.

Figure 5:
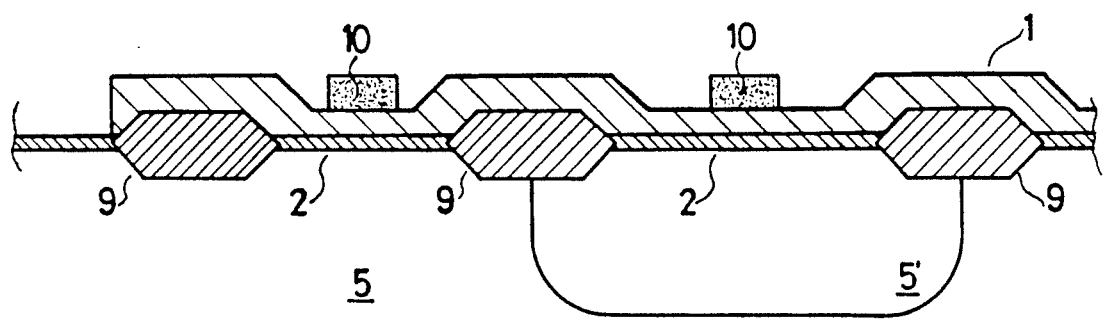
Figure 6:
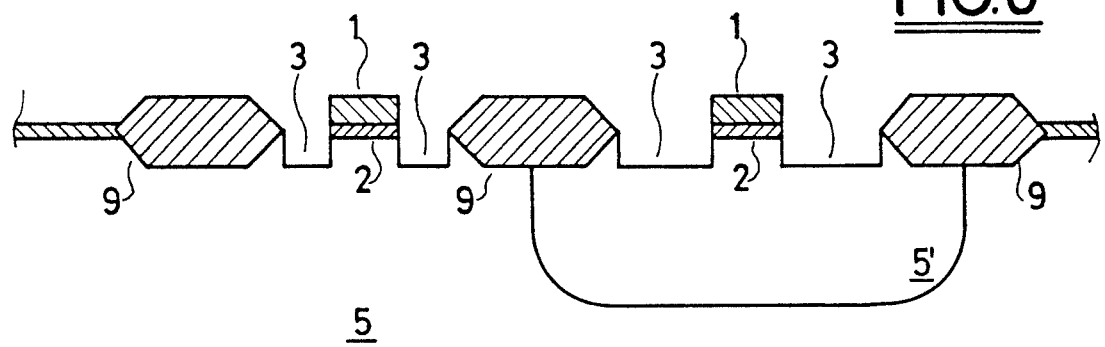

As shown in FIG. 5, in a monocrystalline silicon substrate 5 a tub region 5' is formed by doping the silicon with impurities of an electrically opposite sign in respect to the impurities of the semiconducting silicon substrate 5. A thermally grown field oxide 9 separates the active areas of the device. A thin layer of gate oxide 2 is formed on the active areas after having optionally carried out on ion implantation for adjusting the threshold voltage and for opposing the so-called "punch-through" phenomenon, according to known techniques. After, a polycrystalline silicon layer 1 is deposited and is doped according to common practices and may optionally be covered with a silicide layer (not shown in the figures). A photoresist mask 10 is formed and through the mask the superimposed layers of: silicide (where it is present), polycrystalline silicon 1 and gate oxide 2 are patterned by etching according to common techniques.

At this point the modified process of the invention contemplates the etching of the monocrystalline silicon substrate 5 through the same mask used for defining the gate structure in order to form a depression 3 in the drain regions (and also in the source regions for the case depicted in the figure) having a depth which may be comprised between 50 and 500 nm. Of course, where the excavation of the silicon is desirably made only in the drain area of transistors, the relative source areas will be protected by means of an additional, purposely formed, photoresist mask.

Figure 7:
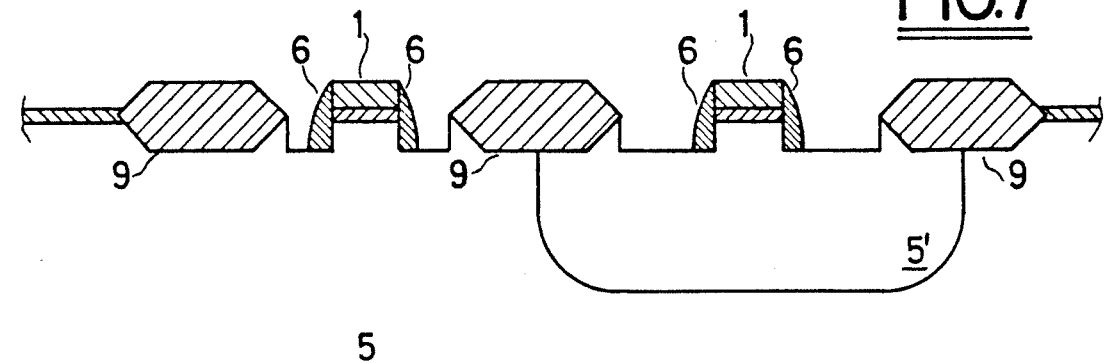

At this point, according to a preferred embodiment of the invention, oxide spacers 6 may be formed on the flanks of the gate structure of the transistors, according to anyone of the known techniques, as depicted in FIG. 7. In any case, whether the formation of spacers 6 is contemplated or not, it is preferable to carry out an annealing heat treatment in order to remove possible structural damages of the semiconductor crystal lattice which may have been produced by the etching of the monocrystalline silicon. For instance, an annealing heat treatment at a temperature comprised between 550° and 650° C. for a period comprised between 3 and 6 hours in a nitrogen atmosphere, according to what is taught in the prior U.S. patent application Ser. No. 07/359,963 of the same assignee, is particularly effective.

Figure 8:
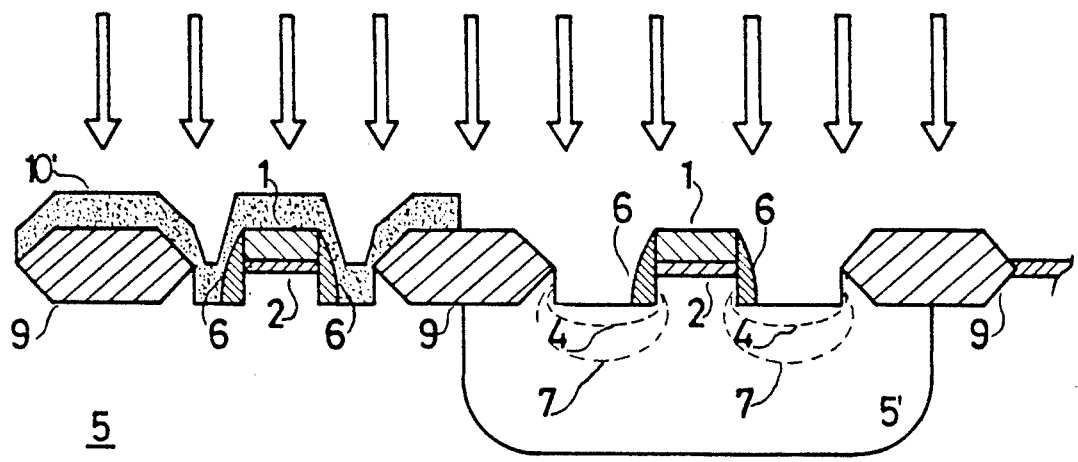

As shown in FIG. 8, after having formed a new photoresist mask 10' for protecting the active areas of the transistors of a first polarity, the active areas (source and drain areas) of the transistors of the opposite polarity are implanted. As in the embodiment schematically depicted in FIG. 8, the ion implantation and the subsequent diffusion heat treatment may be repeated in order to form regions 7 and 4 having a graduated doping, wherein the more external region 7 has a relatively lower dopant concentration than the more heavily doped inner region 4.

Figure 9:
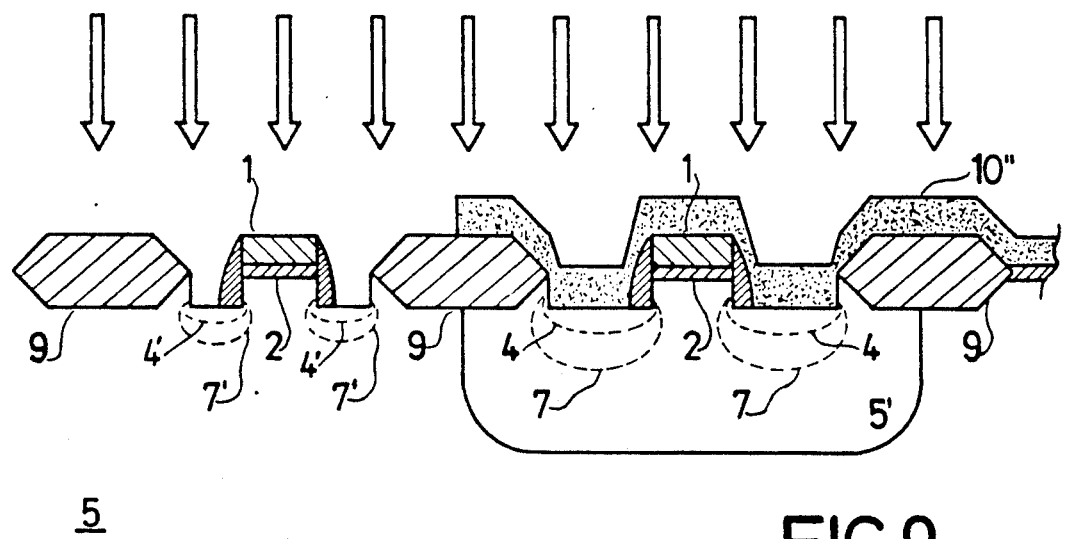

As shown in FIG. 9, the implantation and diffusion steps for forming the source and drain junctions are repeated, in a complementary manner for the transistors of said first polarity (complementary transistors), after having masked by means of another photoresist mask 10" the transistors of said opposite polarity already implanted.

The surface of the silicon substrate 5, in the exposed areas, is passivated by a re-oxidation of the silicon for a thickness of at least 50 nm, in accordance with well known techniques, and the fabrication process may proceed in a completely standard manner.

As it is evident to the skilled technician, a surface field effect integrated transistor having the structure of the present invention, may be used also for forming transistors either than MOSFET, i.e. wherein the gate dielectric layer is made with a material different from an oxide or wherein the gate electrode is made with a nonmetallic conducting material.

The field effect transistor structure of the invention may be used for making unitary storage cells of the SRAM or DRAM type and may also be used for forming floating gate type memory cells such as EPROM, EEPROM and FLASH cells having peculiar write-in characteristics.

What we claim is:

1. A surface field effect integrated transistor formed in a semiconducting substrate having a surface region with an electrical conductivity of a first type constituting a channel region of the transistor, which channel region is confined from one side by a source region and from an opposite side by a drain region, both having a conductivity of opposite type in respect to said channel region and being formed by implanting and diffusing a dopant in the semiconductor through respective drain and source areas of the surface of said semiconducting substrate, said channel region being topped with a gate electrode formed above the semiconducting substrate and electrically isolated therefrom by a dielectric gate layer, said source and drain regions being electrically contacted through contacts between the semiconducting substrate and a conducting material deposited on said respective areas, wherein the surface of the semiconducting substrate in the area of said drain region has a level lower than the level of the surface of the semiconducting substrate in the area of said channel region which is topped with said dielectric gate layer and said gate electrode, the difference between the levels of the surface of the semiconducting substrate in the gate area and in the drain area being between 50 and 500 nanometers.

2. The transistor according to claim 1, wherein said semiconducting substrate is excavated in said drain area to provide said difference between the levels of the surface of the semiconducting substrate in the gate area and in the drain area.

3. The transistor according to claim 1, wherein the surface of the semi-conducting substrate is similarly lowered also in the source area of the transistor beside in the drain area thereof.

4. The transistor according to claim 3, wherein spacers in the form of tapered appendices of a dielectric material are present on opposite sides of said gate electrode and of said dielectric gate layer and of the vertical wall of the semiconducting substrate whose surface in the drain and source areas confining on opposite sides said gate area; is lower than in the gate area the implantation of said dopant for forming said drain and source regions taking place through apertures defined, near the gate area, by said spacers of dielectric material.

5. The transistor according to claim 4, wherein said drain and source regions comprise a first region having a concentration of dopant atoms markedly lower than the concentration of dopant atoms of a second inner region contained within said first region.

6. The transistor of claim 1 wherein said drain region is rounded at its bottom corner.

* * * * *